United States Patent
Seo

(10) Patent No.: US 7,149,951 B2
(45) Date of Patent: Dec. 12, 2006

(54) COMMON MEMORY DEVICE AND CONTROLLING METHOD THEREOF

(75) Inventor: Seung-Wan Seo, Seoul (KR)

(73) Assignee: LG Electronics Inc., Seoul (KR)

( * ) Notice: Subject to any disclaimer, the term of this patent is extended or adjusted under 35 U.S.C. 154(b) by 812 days.

(21) Appl. No.: 10/197,730

(22) Filed: Jul. 19, 2002

(65) Prior Publication Data

US 2003/0018942 A1    Jan. 23, 2003

(30) Foreign Application Priority Data

Jul. 19, 2001    (KR)   .............................. 2001-43464

(51) Int. Cl.
    *H03M 13/03*      (2006.01)
(52) U.S. Cl. ................................... 714/786
(58) Field of Classification Search ........ 714/794–796, 714/791, 746, 752, 786; 375/262, 265, 341; 341/91
    See application file for complete search history.

(56) References Cited

U.S. PATENT DOCUMENTS

| 5,432,804 | A | 7/1995 | Diamondstein et al. ........ 371/43 |
| 6,484,283 | B1 * | 11/2002 | Stephen et al. ............. 714/786 |
| 6,678,857 | B1 * | 1/2004 | Sindhushayana et al. ... 714/755 |
| 6,813,742 | B1 * | 11/2004 | Nguyen ....................... 714/794 |

FOREIGN PATENT DOCUMENTS

EP    1 047 217 A2    10/2000

OTHER PUBLICATIONS

Stephen B. Wicker "Error Control Systems for Digital Comunication and Storage" Prentice Hall 1995, pp. 314-330.
Claude Berrou et al. "Near Optimum Error Correcting Coding and Decoding: Turbo-Codes" IEEE, vol. 44, No. 10, Oct. 1996, pp. 1261-1271.
Steven S. Pietrobon "A Turbo/MAP Decoder for use in Satellite Circuits" ICICS '97, Sep. 9, 1997, pp. 427-431.
A. Hmimy et al. "Performance of Turbo-Codes for WCDMA Systems in Flat Fading Channels" IEEE 1999, pp. 452-456.
Chinese Office Action dated Feb. 14, 2005.

* cited by examiner

*Primary Examiner*—Shelly Chase
(74) *Attorney, Agent, or Firm*—Fleshner & Kim, LLP

(57) ABSTRACT

A mobile terminal in a mobile communications system stores received data with less hardware and more power-efficient power requirements compared with conventional terminals. These advantages are achieved by using a single memory to store data decoded by a plurality of decoder units. More specifically, the terminal performs the steps of selecting one of two decoders for decoding data, decoding data in the selected decoder, determining an address of a common memory connected to the two decoders based on information in the decoded data; and storing the decoded data in the address of the common memory. The first decoder may be a viterbi decoder and the second decoder may be a turbo decoder. The common memory addresses may be determined based on the values of predetermined bits of decoded data output from the decoders. By using a common memory for this purpose, the terminal is able to realize a smaller size than could previously be attained.

37 Claims, 4 Drawing Sheets

COMMON MEMORY DEVICE AND CONTROLLING METHOD THEREOF

BACKGROUND OF THE INVENTION

1. Field of the Invention

The present invention relates to storing information in a memory, and more particularly to a system and method for storing decoded data in a memory connected to two or more data decoders.

2. Background of the Related Art

Generally, errors are generated when data is transmitted in a digital communications system. In order to correct these errors, various types of error control codes (e.g., channel codings) are used. These error control codes include a block code and a convolution code. The block code performs data coding and decoding as block units of some fixed length. Convolution coding performs coding by comparing present data to previous data using a linear shift register.

A viterbi algorithm is one type of decoding method used in convolution coding. A hardware complexity of the viterbi algorithm is increased as a square of a size of limited length (K). At present, a size of K=9 is used. Sizes higher than 9 are not used because the hardware complexity is too large. A structure of K=9 is used in CDMA (IS_95) and a viterbi code of K=9 is used with the turbo code in IMT-2000, which is the next generation mobile communication standard.

A turbo code is a code generated by connecting in parallel two recursive systematic convolution encoders (RSC) through an inner interleaver. This type of code is used in a coding method for transmitting data at high transmission rates in the next generation mobile communication standard. Turbo codes have proven to have superior coding gain to that of convolution coding. In addition, decoding for simple component codes is repeated on the receiving end, and thereby, the above method has a superior error correction function.

FIG. 1 shows a manner in which data is decoded in a mobile terminal according to the background art. The mobile terminal comprises: a receiver 10 for processing baseband data from a radio section; a memory 20 for storing received data; a central processing unit (CPU) 40 for controlling the data stored in the memory 20 so as to be inputted into a predetermined decoder; a switch 30 for switching between two decoders based on a controlling signal from the CPU 40; a viterbi decoder 50 for viterbi decoding the data input from memory 20; and a turbo decoder 60 for turbo decoding the data input from memory 20. The viterbi decoder 50 comprises a viterbi logical calculating unit 51 and a viterbi memory 52. And, the turbo decoder 60 comprises a turbo logical calculating unit 61 and a turbo memory 62.

The process of decoding data according to the background art will now be described with reference to FIG. 1. Initially, the receiver 10 receives data from an antenna (not shown) and transmits the data as frame unit to the memory 20. The memory 20 stores the frame of data transmitted from the receiver 10 as a predetermined size. When the data is stored in the memory 20, the CPU 40 identifies that the data is stored in the memory 20 and transmits a controlling signal, in the form of a decoding selection signal, to switch 30 in the decoding order indicated in next-generation specification 3GPP TS34.108. More specifically, the viterbi decoding or turbo decoding order is prescribed in specification 3GPP TS34.I08, and the viterbi decoding or the turbo decoding is performed in accordance with this specification.

If the viterbi decoding is set based on specification 3GPP TS34.108, the process will be as follows. First, the CPU 40 identifies that the viterbi decoding is set based on the specification 3GPP TS34.108, and transmits the viterbi decoding selection signal to the switch 30. Switch 30 receives the viterbi decoding selection signal, and is controlled toward the viterbi decoder 50. When the switch 30 is controlled toward the viterbi decoder 50, the CPU 40 transmits a data transmission signal to the memory 20. When the memory 20 receives the data transmission signal, it transmits the data to the viterbi decoder 50 through switch 30 which is controlled toward the viterbi decoder 50.

In a next step, the viterbi decoder 50 transmits the received data to a branch metric generator (BMG, not shown) of the viterbi logical calculating unit 51. The BMG (not shown) calculates a branch metric (BM) value from the received data, and the calculated value inputted to an add-compare-select (ACS, not shown) of the viterbi logical calculating unit 51. The BM of the BMG is a difference between a reference data generated by a state transition diagram and the transmitted data, and is defined as a hamming distance.

In a next step, the ACS (not shown) adds the BM value input from the BMG and a path metric (PM) value generated by the previous data, and transmits state transition information of smaller value to the viterbi memory 52 for the trace back decoding operation. The viterbi memory 52 stores the state transition information transmitted from the ACS (not shown) of the viterbi logical calculating unit 51, and the path data stored through the above process is traced back after a predetermined time has passed to obtain a survival path. Then, the gained survival path is stored.

When the survival path is stored in the viterbi memory 52, the viterbi decoder 50 performs decoding for the received data and stores the data in another memory (not shown).

The survival path stored in the viterbi memory 52 is used when the decoded data which is stored in another memory (not shown) is used.

If the turbo decoding is set based on the specification 3GPP TS34.108, the process will be described as follows. First, CPU 40 identifies that the turbo decoding is set based on the specification 3GPP TS34.108, and transmits a turbo decoding selection signal to switch 30. Switch 30 receives the turbo decoding selection signal and controls the switch toward the turbo decoder 60. When the switch is controlled to face the turbo decoder 60, CPU 40 transmits a data transmission signal to memory 20. In response, memory 20 transmits the data to the turbo decoder 60 through switch 30, which is controlled toward the turbo decoder 60.

In a next step, turbo decoder 60 receives the data and transmits the received data to the turbo logical calculating unit 61 in the turbo decoder 60. The turbo logical calculating unit 61 transmits a log likelihood ratio (LLR), which is gained by calculating the state transition posterior of the information included in the received data, to the turbo memory 62. The turbo memory 62 then stores the transmitted LLR.

When the LLR is stored in the turbo memory 62, the turbo decoder performs decoding for the received data, and then stores the decoded data in another memory (not shown). The LLR, which is stored in the turbo memory 62, is used when the data stored in another memory (not shown) is used.

The background art mobile terminal described above has a number of significant drawbacks. Perhaps most importantly, the background art terminal uses separated memories to perform the decoding of the viterbi decoder 50 and of the turbo decoder 60. As a result, the size of the memory requirements is as large as 256×16×4×2, and therefore a size of the terminal hardware is also increased. Further, as the size of the hardware is increased, the power consumption for driving the hardware is increased.

SUMMARY OF THE INVENTION

An object of the present invention is to provide a system and method for transmitting information in a mobile communications system which overcomes the drawbacks of the Background Art.

Another object of the present invention is to achieve the aforementioned object by providing a mobile terminal which stores decoded data in a common memory connected to a viterbi decoder and a turbo decoder. The terminal includes a conversion unit for mapping the common memory for storing data from the viterbi decoder and the turbo decoder. By using a common memory to store this data, the size and amount of hardware of the terminal are reduced, and power consumption for driving the hardware is also reduced since the size of the hardware is reduced.

These and other objects of the present invention are achieved by providing a mobile terminal comprising: a memory for storing received data; a plurality of decoders for decoding the data; a common memory for storing data generated during decoding in the plurality of decoders; a switch for controlling the data stored in the memory to be inputted into a corresponding decoder; a conversion unit setting memory assignment so that the plurality of decoders and the common memory can be matched; and a central processing unit (CPU) for controlling the switch and the conversion unit.

Also, there is provided a method for controlling a common memory in which the decoding data is stored in common comprising: a step of identifying decoding order; a step of transmitting a viterbi decoding selection signal to the switch and to the conversion unit from the CPU, when the decoding order is the viterbi decoding; a step of setting viterbi decoding memory assignment in the conversion unit; a step of performing decoding in the viterbi decoder by receiving data from the memory in the viterbi decoder; a step of transmitting data generated during the decoding to the common memory through the conversion unit; and a step of storing the received data in the common memory.

An object of the present invention can be achieved in parts or whole by a common memory device, comprising a first memory for storing received data, a plurality of decoders for decoding the data, a common memory which stores data generated from the decoders, a switch which connects the first memory to the decoders, a conversion unit which controls assignment of addresses in the common memory so that the decoders and the common memory are matched with each other, and a central processing unit (CPU) which controls the switch and the conversion unit.

An object of the present invention can be achieved in parts or whole by a method for controlling a common memory device, comprising identifying a decoding order between at least a first decoder and a second decoder, selecting one of the first decoder and the second decoder based on the decoding order, setting an address assignment in a common memory based on the selected decoder, decoding data in the selected decoder, and storing the decoded data in the common memory based on said address assignment.

An object of the present invention can be achieved in parts or whole by a method for processing data, comprising selecting one of two decoders for decoding data, decoding data in the selected decoder, determining an address of a common memory connected to the two decoders based on information in said decoded data, and storing the decoded data in the address of said common memory.

An object of the present invention can be achieved in parts or whole by a system for processing data, comprising a first decoder, a second decoder, a first processor which selects one of the two decoders for decoding data, and a second processor which determines an address of a common memory connected to the first and second decoders based on information decoded the selected decoder.

An object of the present invention can be achieved in parts or whole by a method for assigning addresses, comprising receiving decoded data from one of two decoders, and determining an address of a common memory connected to the two decoders based on information in said decoded data.

An object of the present invention can be achieved in parts or whole by a memory assignment unit, comprising a first module which receives decoded data from one of two decoders, and a second module which determines an address of a common memory connected to the two decoders based on information in said decoded data.

The foregoing and other objects, features, aspects and advantages of the present invention will become more apparent from the following detailed description of the present invention when taken in conjunction with the accompanying drawings.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
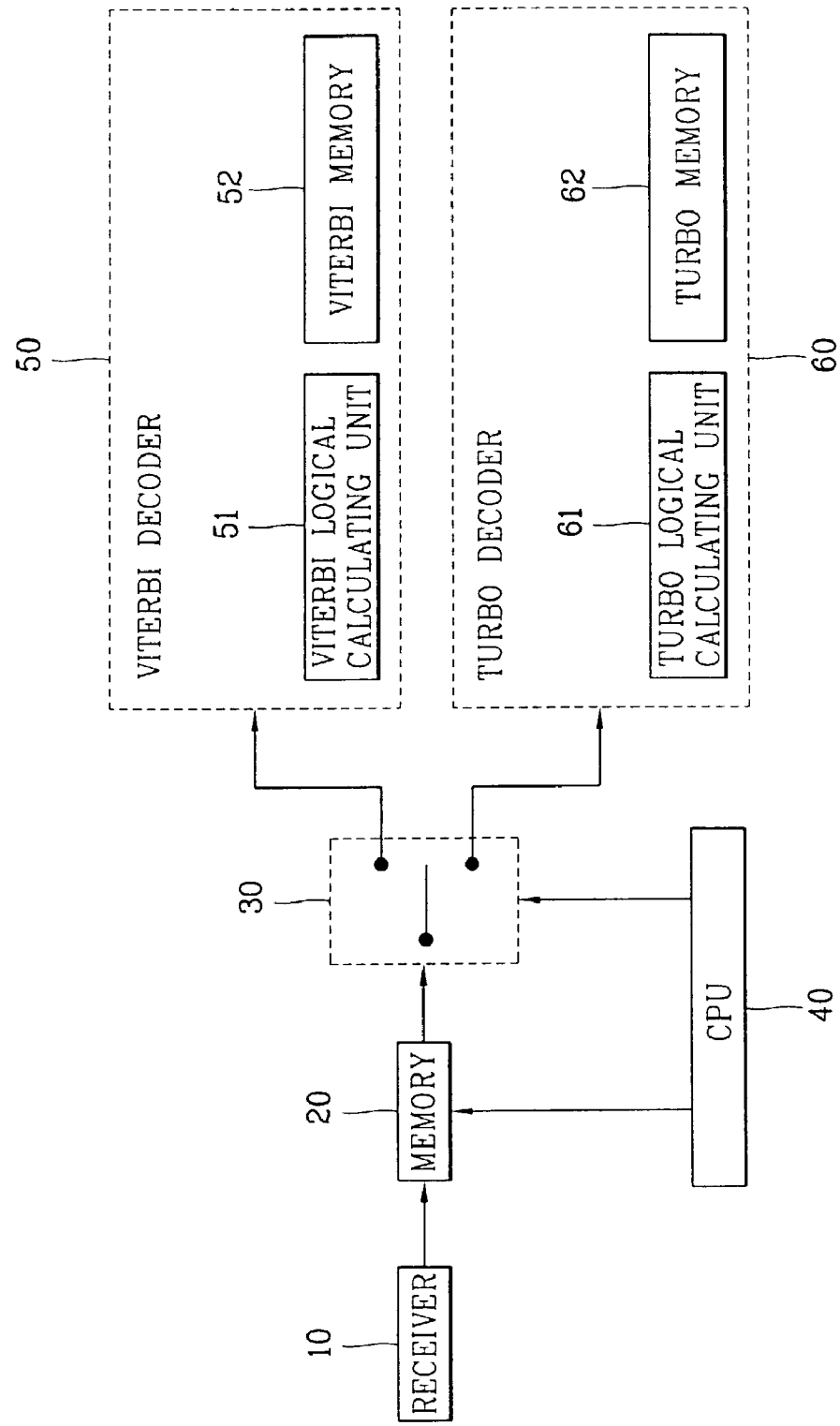
FIG. 1 is a block diagram showing a process of decoding data in a mobile terminal according to the conventional art.
Figure 2:
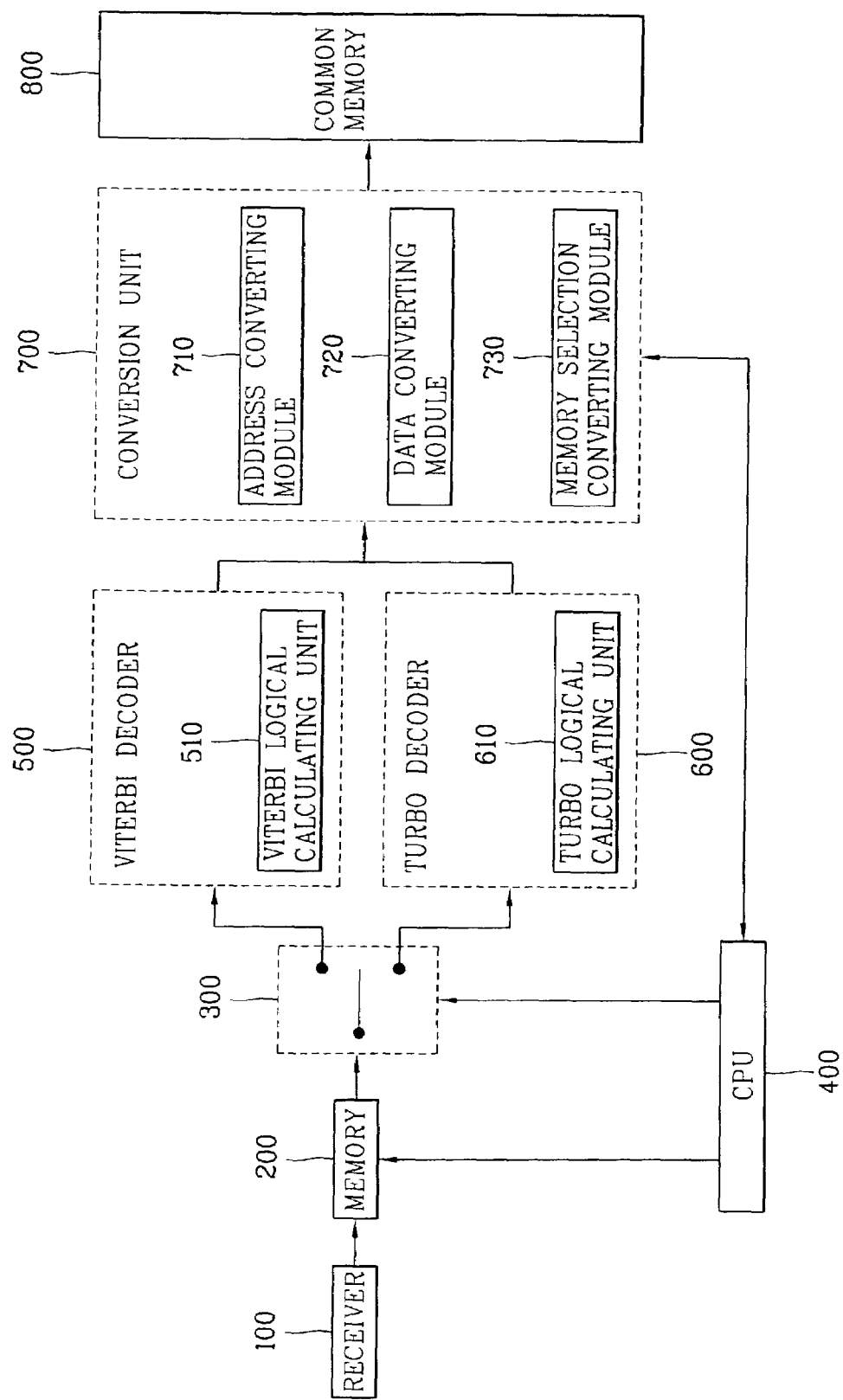
FIG. 2 is a block diagram showing a process of decoding data in a mobile terminal according to the present invention.

FIG. 2 is a block diagram showing a process of decoding data in a mobile terminal according to one embodiment of the present invention. The mobile terminal includes a receiver 100 for receiving data from an antenna (not shown), a memory 200 for storing the received data, a central processing unit (CPU) 400 for controlling the data stored in memory to be input into a predetermined decoder; and a switch 300 which is controlled to connect to a decoder based on a control signal of the CPU 400. The decoders include a viterbi decoder 500 for viterbi decoding data input from the memory 200, and a turbo decoder 600 for turbo decoding data input from the memory 200. The terminal further includes a common memory unit 800 which the viterbi decoder 500 and the turbo decoder 600 are able to access for storing data in common. A conversion unit 700 is also included for setting a memory assignment of the viterbi decoder 500 and the turbo decoder 600 and then mapping them to the common memory 800.

The viterbi decoder 500 includes a viterbi logical calculating unit 510, and the turbo decoder 600 includes a turbo logical calculating unit 610.

The conversion unit 700 includes an address converting module 710 for converting an address of the decoder and transmitting it to the common memory 800, a data converting module 720 for dividing data of the decoder so that the data is transmitted/received between the common memory 800 and another memory (not shown), and a memory selection converting module 730 for selecting a part of an address, which is higher or lower than the decoder address, and for outputting a corresponding selection signal.

Figure 3:
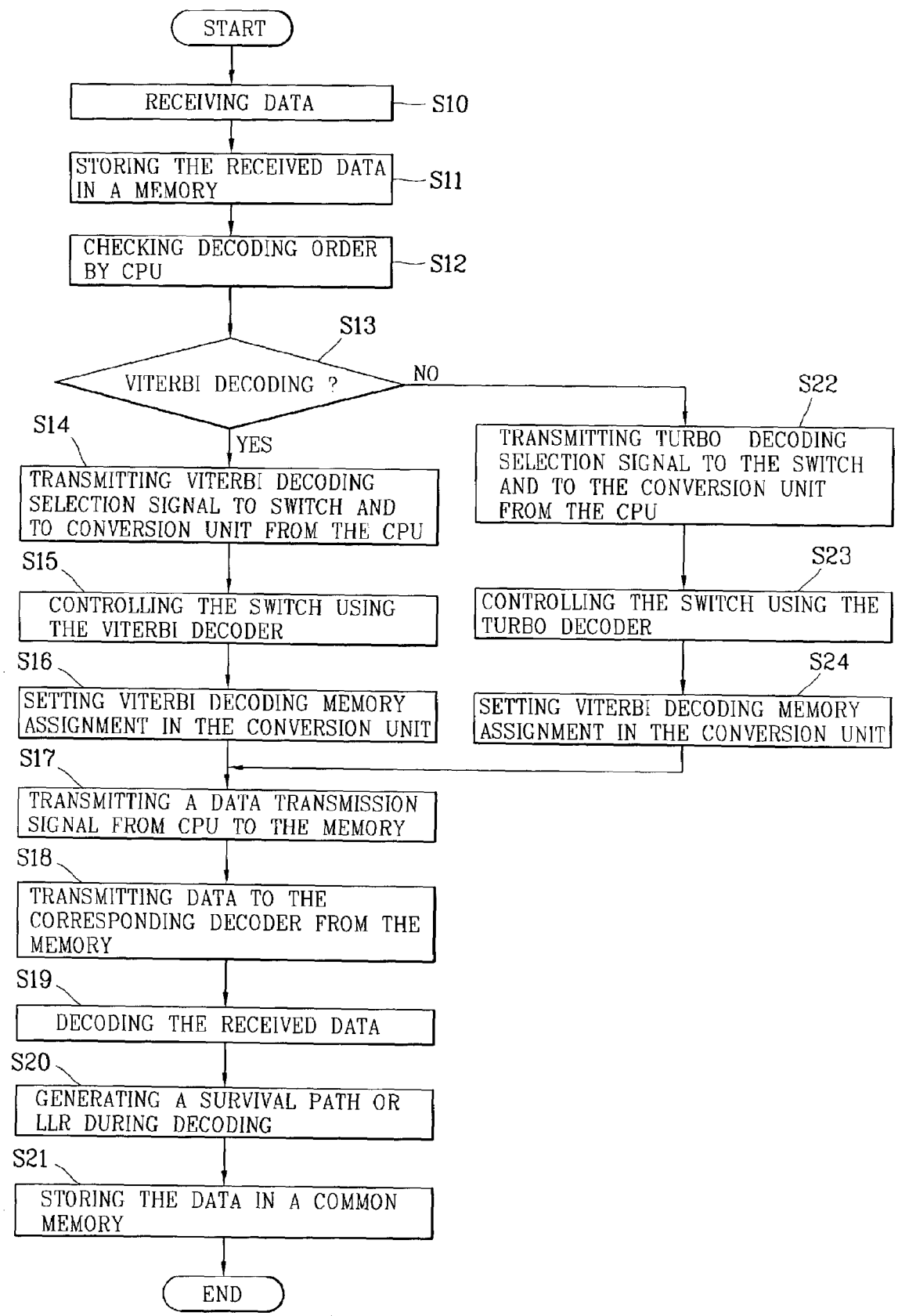
FIG. 3 is a flow chart for describing the process of decoding data in the mobile terminal according to the present invention.

FIG. 3 is a flow chart showing steps included in a method of decoding data in a mobile terminal according to an embodiment of the present invention. This method is described with reference to FIGS. 2 and 3 concerning this description, it is noted that the processes of receiving data from an antenna (not shown), storing data transmitted through the receiver in the memory 200, and checking the decoding order by the CPU 400 using the spec are same as those of the conventional art, and therefore an explicit descriptions for these steps are omitted (S10~S13).

After the initial processing steps, the method continues with the CPU 400, which checked the decoding order, transmitting a corresponding decoding selection signal to the switch 300. At the same time, the CPU may transmit the same decoding selection signal to the conversion unit 700 (S14 and S22).

In a next step, the switch 300, which received a predetermined decoder selection signal, that is, a control signal from CPU 400, is controlled to establish a connection with the corresponding decoder (S15 and S23).

Also, the conversion unit 700, which received the control signal from the CPU 400, starts to set up a configuration for storing a survival path or a log likelihood ratio (LLR), generated in the corresponding decoding logical calculating unit, in the common memory 800 based on the control signal, i.e., the signal for selecting a predetermined decoding (S16 and S24).

Figure 4:
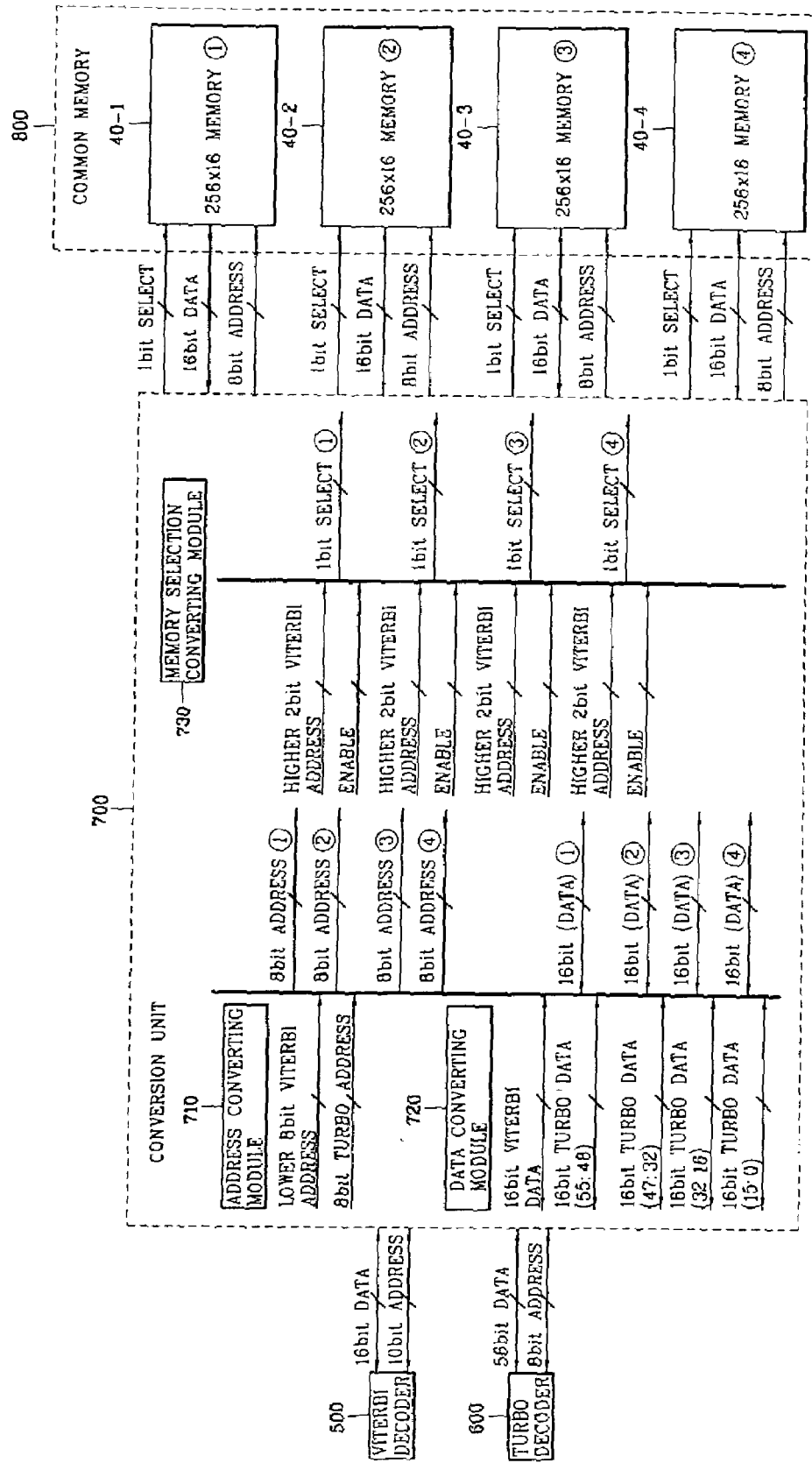
FIG. 4 is a block diagram showing an embodiment for describing a memory assigning process according to the present invention.

A method of setting up the corresponding decoding memory assignment in the conversion unit 700 will now be described with reference to FIG. 4. This figure shows an embodiment of the present invention, in which the viterbi decoder 500 assigns the memory into 16 bits for data and 10 bits for address, the turbo decoder 600 assigns the memory 56 bits for data and 8 bits for address, and the common memory 800 has a size of 256×16×4, where "4" here indicates that common memory 800 includes four memories or memory sections.

In the case of a viterbi memory assignment, the processes where the conversion unit 700 receives the survival path from the viterbi decoder 500 and sets the memory assignment of the viterbi memory will be described as follows.

First, the address converting module 710 in conversion unit 700 transmits lower 8 bits in the address of 10 bits to four common memories at the same time. The data converting module 720 transmits the data of 16 bits to four common memories. Also, the memory selection converting module 730 transmits a selection signal to one of the four common memories 800 based on higher 2 bits in the 10 bits address. That is, if the higher 2-bits have a value of 0(00), the first common memory 40-1 is operated; if the higher 2-bits have a value of 1(01), the second common memory 40-2 is operated; if the higher 2-bits have a value of 2(10), the third common memory 40-3 is operated; and if the higher 2-bits have a value of 3(11), the fourth common memory 40-4 is operated.

In the case of turbo memory assignment, the method performed by the conversion unit 700 for receiving the survival path from the viterbi decoder 500 and for setting the viterbi memory assignment will be described as follows.

First, the address converting module 710 of the conversion unit 700 transmits the address of 8 bits to four common memories 800. The data converting module 720 then divides the data of 56 bits into 16 bits, and transmits the data to the four common memories 800. At that time, when the 56 bits are divided by 8 bits, 8 bits remain. Therefore, higher 16 bits among the 16 bits transmitted to the first common memory 40-1 are filled with 0. The memory selection converting module 730 outputs the selection signals to all of the four common memories 800.

When the conversion unit 700 completes the setting for the decoding memory assignment, CPU 400 transmits the data transmission signal to the memory 200 (S17). The memory 200 receives the data transmission signal, and transmits the data to the corresponding decoder through switch 300, which is controlled to face the corresponding decoder (S18).

The switch 300 receives the corresponding decoding selection signal from the CPU 400, and is already controlled toward the corresponding decoder. The process of controlling the switch is same as that of the conventional art, and therefore, description for that is omitted.

The viterbi decoder 500 or the turbo decoder 600 which received the data performs decoding for the received data (S19). The data decoded in the viterbi decoder 500 or in the turbo decoder 600 is stored in another memory (not shown), and the survival path or the LLR generated during the decoding process is transmitted and stored in the common memory 800 through the conversion unit 700 (S20–S21).

The conversion unit 700 has already received the predetermined decoding selection signal, that is, the control signal from the CPU 400, and therefore is already set to the memory assignment, so that the survival path or the LLR transmitted from the viterbi decoder 500 or the turbo decoder 600 can be stored in the common memory 800.

In accordance with the present invention, the common memory 800 functions as a memory for the viterbi decoder 500 when the viterbi decoding is performed, and functions as a memory for the turbo decoder 600 when the turbo decoding is performed. The survival path or the LLR stored in the common memory as described above is used when the decoded data which is stored in another memory (not shown) is used.

In summary, the mobile terminal according to the present invention decodes data using a common memory which is able to store the survival path or the LLR generated when the data is viterbi decoded or turbo decoded. Moreover, a conversion unit is used for mapping the common memory relative to the selected viterbi decoder 500 or the turbo decoder 600. As a result, the size of the memory can be significantly reduced to 256×16×4 and the size of hardware may also be reduced compared with the conventional art. Also, since the size of the hardware is reduced, power consumption for driving the hardware may be also reduced.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A common memory device, comprising:
a first memory for storing received data;
a plurality of decoders for decoding the data;
a common memory which stores data generated from the decoders;
a switch which connects the first memory to the decoders;
a conversion unit which controls assignment of addresses in the common memory so that the decoders and the common memory are matched with each other; and
a central processing unit (CPU) which controls the switch and the conversion unit.

2. The device of claim 1, wherein the decoders include a viterbi decoder and a turbo decoder.

3. The device of claim 2, wherein the common memory stores a survival path or a log likelihood ratio (LLR) respectively generated by the viterbi decoder and the turbo decoder.

4. The device of the claim 2, wherein the common memory stores the data generated by the viterbi decoder, when the switch connects the first memory to the viterbi decoder.

5. The device of claim 4, wherein the viterbi decoder comprises a viterbi logical calculating unit.

6. The device of claim 2, wherein the common memory stores the data generated in the turbo decoder when the switch connects the first memory to the turbo decoder.

7. The device of claim 6, wherein the turbo decoder comprises a turbo logical calculating unit.

8. The device of claim 1, wherein the conversion unit comprises:
an address converting module which converts addresses of the decoders and transmits the addresses to the common memory;
a data converting module which divides data of the decoders for communication between the common memory and another memory; and
a memory selection converting module which selects a part of an address which is higher or lower than a decoder address, and which outputs a selection signal corresponding to the address.

9. The device of claim 1, wherein the CPU transmits a decoding selection signal to the switch and to the conversion unit at the same time.

10. The device of claim 1, wherein the CPU transmits a data transmission signal to the memory when the conversion unit completes setting a common memory address assignment.

11. A method for controlling a common memory device, comprising:
identifying a decoding order between at least a first decoder and a second decoder;
selecting one of the first decoder and the second decoder based on the decoding order;
setting an address assignment in a common memory based on the selected decoder so that the decoders and the common memory are matched with each other;
decoding data in the selected decoder; and
storing the decoded data in the common memory based on said address assignment.

12. The method of claim 11, wherein the decoding order is set according to a predetermined communications standard.

13. The method of claim 11, wherein the selecting step includes selecting one of the first decoder and second decoder based on a decoding selection signal output from a CPU.

14. The method of claim 11, further comprising:
transmitting data to the selected decoder when the setting step is completed.

15. The device of claim 11, wherein the first decoder is a viterbi decoder, and wherein the common memory stores a survival path generated by the viterbi decoder.

16. The device of claim 15, further comprising:
storing the data generated by the viterbi decoder when the viterbi decoder is selected.

17. The method of claim 11, wherein one of the first decoder and the second decoder is a turbo decoder, said method further comprising:
transmitting a turbo decoding selection signal for selecting the turbo decoder to a switch and a conversion unit which performs said setting step.

18. The method of claim 17, wherein the conversion unit sets the common memory address assignment when the turbo decoding selection signal is received.

19. The method of claim 11, wherein one of the first decoder and second decoder is a turbo decoder, and wherein the common memory stores a log likelihood ratio (LLR) generated by the turbo decoder through an address conversion unit.

20. The method of claim 19, further comprising:
storing data generated by the turbo decoder when the turbo decoder is selected.

21. A method for processing data, comprising:
(a) selecting one of first and second decoders for decoding data;
(b) decoding data in the selected decoder;
(c) determining an address of a common memory connected to the two decoders based on information in said decoded data; and
(d) storing the decoded data in the address of said common memory,
wherein the first decoder is a viterbi decoder and the common memory includes a plurality of memory sectors, and
wherein step (c) comprises:
receiving a viterbi decoder address; and
selecting one of the memory sections based on values of a predetermined number of bits of the viterbi decoder address, said predetermined number of bits being less than a total number of bits of the viterbi decoder address.

22. The method of claim 21, wherein the second decoder is a turbo decoder.

23. The method of claim 22, wherein when the turbo decoder is selected, step (c) includes:
receiving a turbo decoder address; and
setting the address of said common memory based on a predetermined number of bits of said turbo decoder address.

24. The method of claim 23, wherein step (d) includes storing an LLR in the address of said common memory.

25. The method of claim 21, wherein step (d) includes storing a survival path in the address of said common memory.

26. A system for processing data, comprising:
a first decoder;

a second decoder;

a first processor which selects one of the two decoders for decoding data; and a second processor which determines an address of a common memory connected to the first and second decoders based on information decoded the selected decoder, wherein the common memory includes a plurality of memory sections, wherein the first decoder assigns the common memory into a first predetermined number of bits for data and a second predetermined number of bits for address, and wherein when the first processor selects the first decoder, the second processor transmits a portion of the second predetermined number of bits for the address to each memory section and transmits a selection signal to one of the memory sections based on the remaining bits not transmitted to the memory for the address.

27. The system of claim 26, wherein the first decoder is a viterbi decoder and the second decoder is a turbo decoder.

28. The system of claim 26, wherein when the first processor selects the turbo decoder, the second processor sets the address of said common memory based on a predetermined number of bits of a turbo decoder address.

29. A method for assigning addresses, comprising:

receiving decoded data from one of first and second decoders; and determining an address of a common memory connected to the two decoders based on information in said decoded data, wherein the first and second decoders assign the common memory into a different number of bits for data and address, and wherein determining the address comprises:
matching the number of address and data bits transmitted to the common memory by converting the address and data bits transmitted from the first and second decoders into a matched number of bits.

30. The method of claim 29, wherein a first decoder is a viterbi decoder and the second decoder is a turbo decoder.

31. The method of claim 30, wherein when viterbi decoder data is received, said determining step includes:

obtaining a viterbi decoder address from the viterbi decoder data; and setting the address of said common memory based on values of a predetermined number of bits of said viterbi decoder address.

32. The method of claim 31, wherein the setting step includes:

selecting one of a plurality of memory sections of said common memory based on the values of the predetermined number of bits of said viterbi decoder address.

33. The method of claim 30, wherein when turbo decoder data is received, said determining step includes:

obtaining a viterbi decoder address from the viterbi decoder data; and setting the address of said common memory based on a predetermined number of bits of said turbo decoder address.

34. A memory assignment unit, comprising:

a first module which receives decoded data from one of two decoders; and a second module which determines an address of a common memory connected to the two decoders based on information in said decoded data, wherein the second module sets the address of said common memory by selecting one of a plurality of memory sections of said common memory based on the values of the predetermined number of bits of said viterbi decoder address.

35. The unit of claim 34, wherein a first decoder is a viterbi decoder and the second decoder is a turbo decoder.

36. The unit of claim 35, wherein when viterbi decoder data is received, the second module sets the address of said common memory based on values of a predetermined number of bits of a viterbi decoder address.

37. The unit of claim 35, wherein when turbo decoder data is received, the second module sets the address of said common memory based on a predetermined number of bits of a turbo decoder address.

* * * * *